US005659220A

United States Patent [19]

Thurn et al.

[11] Patent Number: 5,659,220

[45] Date of Patent: Aug. 19, 1997

[54] ULTRASONIC TRANSDUCER

[75] Inventors: Rudolf Thurn, Pressath; Klaus Busch, Amberg, both of Germany

[73] Assignee: Siemens Aktiengesellschaft, München, Germany

[21] Appl. No.: 381,982

[22] PCT Filed: Jul. 29, 1993

[86] PCT No.: PCT/EP93/02039

§ 371 Date: Feb. 13, 1995

§ 102(e) Date: Feb. 13, 1995

[87] PCT Pub. No.: WO94/05004

PCT Pub. Date: Mar. 3, 1994

[30] Foreign Application Priority Data

Aug. 13, 1992 [EP] European Pat. Off. .............. 92113833

[51] Int. Cl.[6] .................................................. H01L 41/08

[52] U.S. Cl. .......................... 310/369; 310/322; 310/334

[58] Field of Search .................................... 310/322, 324, 310/334, 369

[56] References Cited

U.S. PATENT DOCUMENTS

| | | | |
|---|---|---|---|
| 2,728,869 | 12/1955 | Pohlman | 310/334 |
| 2,875,354 | 2/1959 | Harris | 310/334 |
| 3,421,031 | 1/1969 | Aas et al. | 310/8.5 |
| 3,718,898 | 2/1973 | Cook et al. | 340/10 |
| 4,101,865 | 7/1978 | Schurr | 340/1 L |
| 4,217,684 | 8/1980 | Brisken et al. | 310/334 |
| 4,611,372 | 9/1986 | Enjoji et al. | 310/327 |
| 4,672,591 | 6/1987 | Breimesser ett al. | 310/334 |
| 4,680,499 | 7/1987 | Umemura et al. | 310/334 |
| 5,452,267 | 9/1995 | Spevak | 310/334 |
| 5,457,352 | 10/1995 | Müller et al. | 310/327 |

FOREIGN PATENT DOCUMENTS

| | | | |
|---|---|---|---|
| 0390959A3 | 4/1989 | European Pat. Off. . | |
| 852467 | 1/1952 | Germany . | |
| 3911047C2 | 10/1990 | Germany | H04R 17/00 |

*Primary Examiner*—Thomas M. Dougherty

*Attorney, Agent, or Firm*—Kenyon & Kenyon

[57] ABSTRACT

For industrial applications, there is a need for compact ultrasonic transducers which at the same time have a radiation characteristic with small side lobes. This requirement is met by an ultrasonic transducer of conventional design and having a piezoelectric transducer element (1) which is bonded over its main surface (7) to a disk-shaped λ/4 matching element (2), it being the case according to the invention that the circumferential surface (3) of the λ/4 matching element is profiled with a notch (4) of suitable depth (5).

10 Claims, 3 Drawing Sheets

ULTRASONIC TRANSDUCER

BACKGROUND OF THE INVENTION

The present invention concerns an ultrasonic transducer having a disk-shaped piezoelectric transducer element which is provided with a rotationally symmetrical, disk-shaped λ/4 matching element.

An ultrasonic transducer, of the type mentioned above, is described in German Patent Publication No. DE 39 11 047 ("the '047 publication"). In the transducer of the '047 publication, small changes in the diameter of the main surface of a matching element, relative to the diameter of the piezoceramic transducer element, influence oscillations of the transducer element to improve the efficiency and radiation characteristic of the ultrasonic transducer in conjunction with its small dimensions. The '047 publication also discusses that even small changes in the shape of the circumferential wall of the matching element can substantially change the oscillations of the transducer element. A straight line, which diverges from, or converges to, the piezoceramic element is specified as the configuration of the lateral line of the circumferential surface of the matching element. In this way, the diameter of the main surface of the matching element deviates slightly from the main surface of the piezoceramic transducer element. Depending on the thickness of the matching element relative to the diameter of the transducer element, slightly positively or slightly negatively curved lateral lines are also considered advantageous for the purpose of achieving a relatively centered high sound pressure.

However, the amplitude distribution occurring in the ultrasonic transducers discussed in the '047 specification has a relative minimum in the central region of the radiation surface. The amplitude rises in the radial direction, has its maximum at approximately half the radius, and drops off steeply towards the rim (i.e., the edge). This form of oscillation produces losses in the achievable sound pressure, and the shapes of sound lobes associated therewith have conspicuous side lobes. These losses can lead, in practical use, to faults and malfunctions.

Therefore, the object of the present invention is to provide an ultrasonic transducer of the type mentioned above in which, in conjunction with a compact design, a high sound pressure is achieved because of an improved form of oscillation with the lowest possible losses, and in which the suppression of side lobes is better than −30 dB.

SUMMARY OF THE INVENTION

To achieve the above referenced object, the λ/4 matching element has a notch on its circumferential surface and/or on its rear (i.e., underside) surface facing the transducer element. A particularly good radiation response is achieved when the notch has a depth of up to at most, a quarter of the disk diameter of the matching element. Such ultrasonic transducers are particularly suitable for industrial applications with good acoustic properties and for operations in which air is the ambient medium.

In an easy-to-produce embodiment, the circumferential surface outside the notch has the contour of a regular cylinder. In this case, the notch is subsequently milled, for example, into the circumferential surface in a disk-shaped matching element which is in the shape of a regular cylinder and which is easy to produce.

To achieve a form of oscillation which is effected by few losses, the circumferential surface has a notch at least of such a depth that, given circular surfaces of unequal size at the top side and underside of the λ/4 matching element (i.e., given a matching element with two surfaces of unequal diameter and with a circumferential surface shaped as a part of a cone), the notch cuts an imaginary cylinder lateral surface projected into it and proceeding from the smaller circular surface of the matching element.

If the piezoelectric transducer element has a main surface of diameter D in a direction of the main radiation of the ultrasonic oscillations, and if the underside circular surface of the λ/4 matching element facing the main surface of the piezoelectric transducer element has a diameter of between 0.9 D and 1.2 D, a particularly effective form of oscillation is rendered possible given the variation in this parameter in conjunction with the shape and depth of the notch. The action of the notch with respect to the acoustic properties is particularly good when the depth of the notch is from 5% to 15% of the disk diameter of the matching element.

If the entire ultrasonic transducer, except for the side of the matching element facing the medium to be inspected (i.e., facing away from the piezoelectric transducer element), is encapsulated in foam, contamination in the region of the notch with the indentations and corners is avoided. At the same time, in this case the front surface of the ultrasonic transducer remains planar, which advantageously permits a good possibility of cleaning in the event of contamination of the transducer, as well as of its optically improved appearance. If the foam encapsulation comprises polyurethane, the elastic damping of the ultrasonic transducer, which damping is a principal target of this foam encapsulation, is exceptionally good. If the ultrasonic transducer is used in air as the ambient medium, the impedance matching problem, which exists between the piezoceramic transducer element excited into oscillation and air, is advantageously solved when the λ/4 matching element comprises syntactic foam.

An embodiment in which a notch on the rear (i.e., underside) surface of the matching element is designed as a cylindrical cutout has a particularly favorable radiation characteristic and is simple to produce. An equally effective and simple alternative exists when the notch on the rear (i.e., underside) surface of the matching element is in the form of concentric, annular grooves having a depth of up to at most half the thickness of the matching element.

BRIEF DESCRIPTION OF THE DRAWINGS

The present invention is explained in more detail below with the aid of an exemplary embodiment.

DETAILED DESCRIPTION

Figure 1:
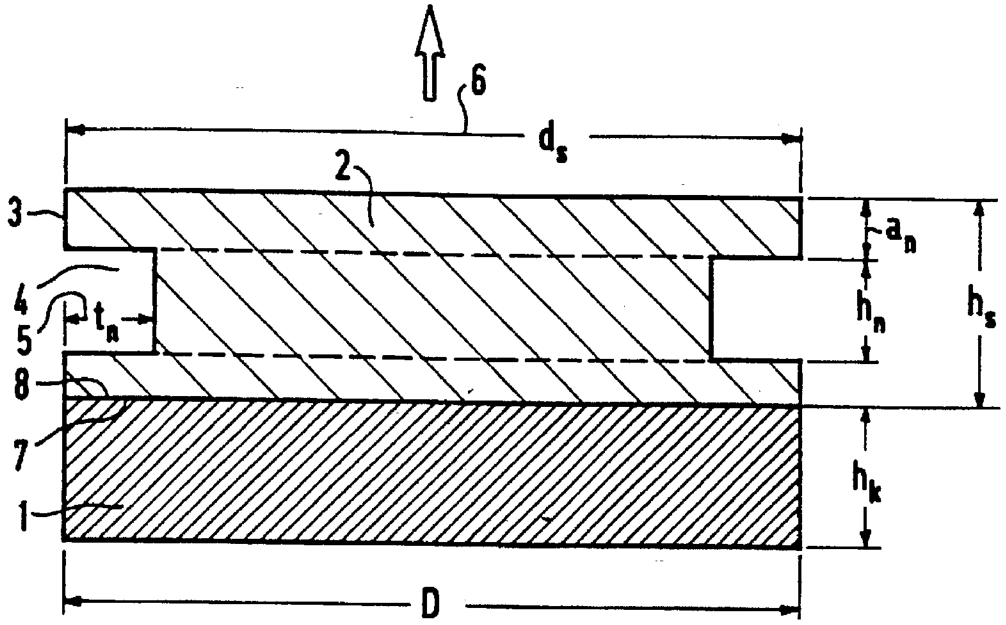
FIG. 1 is a cross-sectional view of an ultrasonic transducer according to the present invention.

FIG. 1 is a cross-sectional view of an ultrasonic transducer according to the present invention having a disk-shaped piezoceramic oscillator 1 having a main surface 7 which is bonded to an underside circular surface 8 of a rotationally symmetrical, disk-shaped λ/4 matching element 2. The piezoceramic oscillator 1 has a diameter D=32.4 mm and a disk thickness $h_k$=6 mm. The material of the oscillator 1 has a density of 7600 kg/m$^3$, an elastic modulus of 65,000 N/mm$^2$ and a transverse contraction of 0.29. The λ/4 matching element 2, which has a shape of a regular cylinder, has a rectangular groove 4 on its circumferential surface 3. The rectangular groove 4 has a depth 5 of $t_n$=3.8 mm and a height of $h_n$=4.5 mm and is therefore shaped as a notch. The groove 4 has a clearance of $a_n$=2.4 mm from the top-side circular surface of the matching element 2, that is, 2.4 mm from the radiation surface of the matching element 2. The disk thickness of the matching element 2 is $h_s$=8.8 mm. The diameter $d_s$ of the matching element 2, which comprises syntactic foam, matches that of the piezoceramic oscillator 1. The material of matching element 2 has a density of 580 kg/m$^3$, an elasticity modulus of 2150 N/mm$^2$ and a transverse contraction of 0.285.

Figure 2:
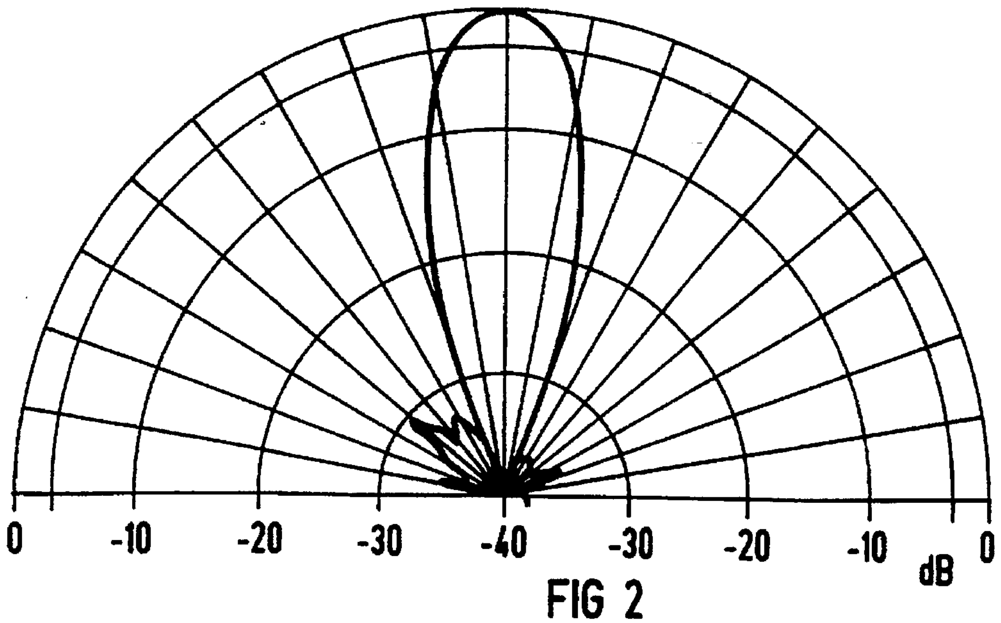
FIG. 2 illustrates the shape of a sound lobe of the ultrasonic transducer of FIG. 1.
Figure 3:
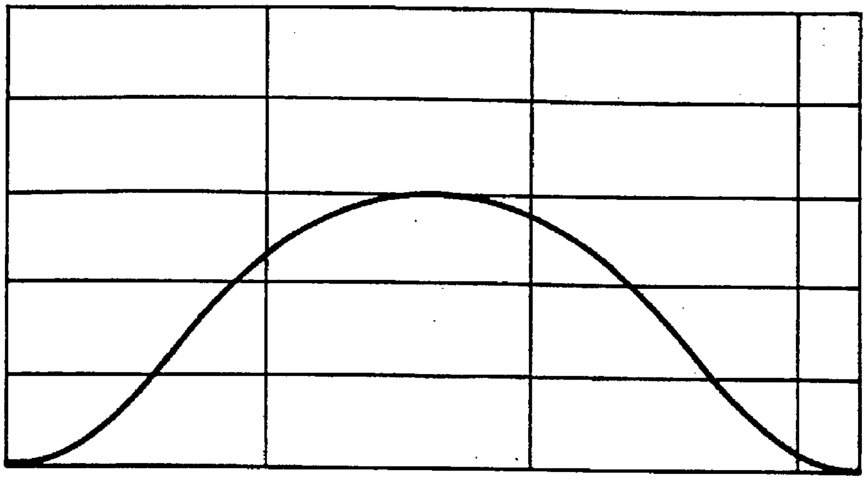
FIG. 3 shows the form of oscillation on the radiation surface of the ultrasonic transducer according to FIG. 1.

The resultant sound lobe of the ultrasonic transducer according to FIG. 1 has the shape illustrated in FIG. 2. As FIG. 2 shows, the sound lobe is virtually free from side lobes. That is, the only side lobes that occur have an oscillation amplitude reduced by more than −30 dB with respect to the main lobe. This exceptionally favorable response is due to the profiling of the lateral cylinder surface of the matching element 2, which entails a mode of oscillation having a virtually ideal distribution of oscillation amplitude on the radiation surface of the λ/4 matching element 2 as shown in FIG. 3. Here, the amplitude is plotted on the ordinate and the longitudinal extent of the radiation surface, that is, the diameter 4 of the radiation surface, is plotted on the abscissa.

Figure 4:
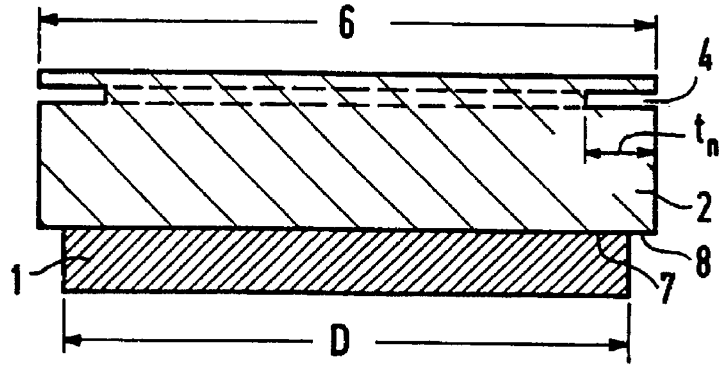
FIG. 4 is a cross-sectional view of an ultrasonic transducer having a rectangular notch on the circumferential surface.
Figure 5:
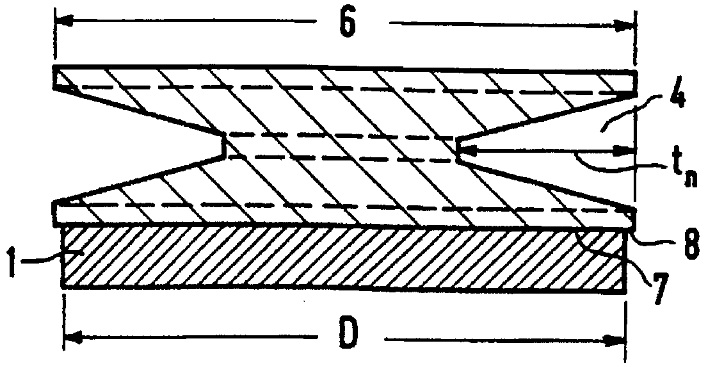
FIG. 5 is a cross-sectional view of an ultrasonic transducer having a trapezoidal notch on the circumferential surface.
Figure 6:
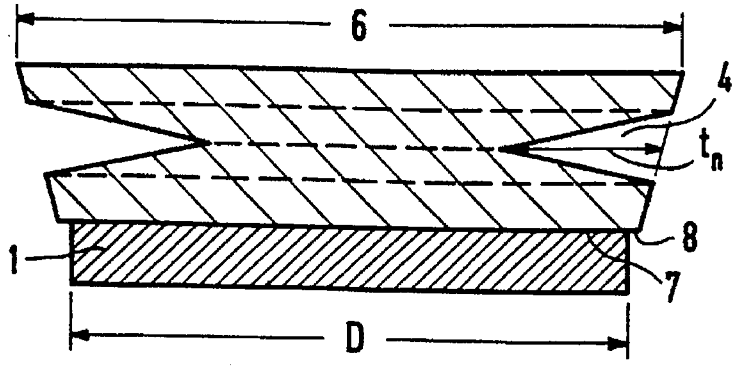
FIG. 6 is a cross-sectional view of an ultrasonic transducer having a triangular notch.

FIGS. 4, 5 and 6 show further embodiments of the transducer of the present invention. In the ultrasonic transducer illustrated in FIG. 4, the notch 4 in the λ/4 matching element 2 is in the shape of a groove as was the case in FIG. 1. However, the underside circular surface 8 of the matching element 2 projects beyond the main surface 7 of the piezoelectric oscillator 1. This influences the shape and position of the groove 4 which are optimum with respect to the form of oscillation.

In the embodiment of the ultrasonic transducer represented in FIG. 5, the notch 4 in the circumferential surface 3 of the λ/4 matching element 2, the matching element 2 being in the form of a regular cylinder, is trapezoidal.

The lateral (i.e., circumferential) surface of the matching element 2, into which the notch 4 is recessed, can also have a conically extending lateral line. This is shown, for example, by FIG. 6, where the notch 4 is triangular in configuration, and the radiation surface of the matching element 2 has a larger diameter than the underside surface 8 of the matching element 2, bonded to the main surface 7 of the piezoceramic oscillator 1.

The notches 4 can be configured as a polygon, or else can be designed as round indented shapes. They can be recessed as matching elements 2 in circumferential surfaces 3 of regular cylindrical or conical disks, the diameter of which matching elements is preferably between 90% and 120% of the diameter D at the bonding surface with the piezoceramic oscillator 1 of diameter D.

The exact geometry of the profiling which produces the optimum form of oscillation according to FIG. 3 depends on the mechanical material data and the external dimensions of the piezoelectric transducer element 1 and of the matching element 2, as a result of which, the order of magnitude of the desired operating frequency is also predetermined. The transducer must be tuned and optimized anew for each combination of material data and external dimensions, as well as for the desired form of deflection.

A narrow main sound lobe without side lobes is advantageous in the majority of applications. It is possible, using the lateral notches according to the present invention, to produce, on the radiation surface, an amplitude distribution of the shape of a Gaussian bell-shaped curve with maximum deviation at the center of the radiation surface and an amplitude which falls continuously towards the edge. Theoretically, the Gaussian curve is the form of deflection which leads to sound lobes which are completely free of side lobes. In practice, the transducers having optimized lateral notches, have extremely weak side lobes as exemplified in FIG. 2. Depending on the embodiment, it is possible to achieve a side lobe suppression of −30 to −40 dB.

Gaussian curves of differing edge steepness and a simultaneous change in the −3 dB width of the main sound lobe can be produced using various notch shapes in the lateral surface. In this case, a wider lobe corresponds to a steep drop, whereas a very narrow lobe corresponds to a flatter curve shape. The aperture angles which can be set thereby are between approximately 8° and 25°. Due to the Gaussian, equal-phase oscillation distribution, the transmission coefficient, that is, the ratio between the voltage of the received echo signal and the associated transmission voltage for a given separation, increases by up to a factor of 5 as compared with an identical transducer without this lateral profiling.

However, it is also possible, by varying the form of the lateral profiling, to produce amplitude and phase distributions on the radiation surface which are other than Gaussian. The sound lobe and the transmission coefficient can be varied within wide limits to produce a "customized" ultrasonic transducer for specific applications.

The present invention achieves advantageous improvements on the sound-radiating front surface by contouring the lateral surface with notches 4. The front surface, that is, the sound radiation surface itself, remains planar without change in this case, and can easily be cleaned when dirty to achieve a good appearance. The ultrasonic transducer can be embedded, except for the radiation surface, in an elastic damping material, preferably poly-urethane. This simultaneously prevents contamination of the lateral contour with its indentations and corners in the region of the notches.

In accordance with the present invention, compact ultrasonic transducers having a radiation characteristic which is virtually ideal, that is to say free from side lobes, can be simply produced. This is achieved with conventional components for ultrasonic transducers by profiling the circumferential surface of the matching element with a notch of suitable shape and depth.

Figure 7:
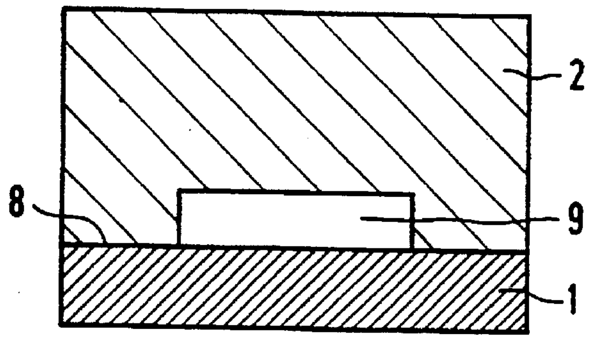
FIG. 7 is a cross-sectional view of an ultrasonic transducer having a cylindrical cutout on the rear (i.e., underside) surface of the matching element.
Figure 8:
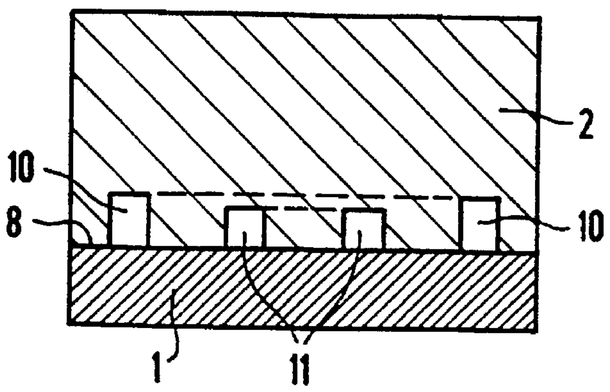
FIG. 8 is a cross-sectional view of an ultrasonic transducer having annular grooves on the rear (i.e., underside) surface of the matching element.

In accordance with the FIGS. 7 and 8, the radiation response of the ultrasonic transducer can be improved, not only by contours on the circumferential surface 3 of the matching element 2, but also by notches 9, 10, 11 on the rear (i.e., underside) surface 8 of the matching element 2 facing the piezoceramic oscillator 1.

A cylindrical cutout 9 is provided on the rear (i.e., underside) surface 8 in FIG. 7. In the ultrasonic transducer represented in FIG. 8, the notches on the rear (i.e., underside) surface 8 of the matching element 2 comprise concentric, annular grooves 10, 11. A particularly favorable radiation response can be achieved by combining lateral notches and notches at rear profiles of the matching element.

We claim:

1. An ultrasonic transducer comprising:

a) a piezoelectric disk-shaped transducer element having an end face; and b) a rotationally symmetrical, disk-shaped λ/4 matching element, the matching element i) having an underside surface facing, and provided on, the end face of the piezoelectric transducer element, ii) having a diameter, iii) having a circumferential surface, and iv) having at least one of a circumferential notch provided on the circumferential surface and a concentric notch provided on the underside surface, wherein any notch provided on the circumferential surface of the matching element has a depth of up to ¼ of the diameter of the matching element and extends completely around the circumference of the matching element, and wherein a fractional surface of the underside surface covered by any notch in the underside surface of the matching element is smaller than the end face of the transducer element.

2. The ultrasonic transducer of claim 1 wherein the circumferential surface of the matching element corresponds to a lateral surface of a cylinder.

3. The ultrasonic transducer of claim 1, wherein the matching element has a radiation surface having a diameter differing from the underside surface of the matching element whereby the circumferential surface of the matching element is shaped as a part of a cone, and wherein the circumferential surface has a notch which is at least of such a depth that the notch breaks an imaginary lateral cylinder surface projected from the smaller of the radiation surface of the matching element and the underside surface of the matching element.

4. The ultrasonic transducer of claim 1 wherein the piezo-electric transducer element has a diameter D, and wherein the underside surface of the matching element facing the transducer element has a diameter of between 0.8 times D and 1.2 times D.

5. The ultrasonic transducer of claim 1 wherein the depth of the notch is 0.05 to 0.15 times the diameter of the matching element.

6. The ultrasonic transducer of claim 1 wherein the matching element includes a radiation surface, the ultrasonic transducer further comprising foam, said foam encapsulating the entire ultrasonic transducer, except for the radiation surface of the matching element.

7. The ultrasonic transducer of claim 6 wherein the foam encapsulation essentially comprises polyurethane.

8. The ultrasonic transducer of claim 1 wherein the λ/4 matching element comprises syntactic foam.

9. The ultrasonic transducer of claim 1 wherein a notch on the underside surface of the matching element is a cylindrical cutout having a depth of up to half the thickness of the matching element.

10. The ultrasonic transducer of claim 1 wherein a notch on the underside surface of the matching element exists in the form of concentric, annular grooves having a depth of up to half the thickness of the matching element.

* * * * *